United States Patent
An et al.

(10) Patent No.: US 12,143,107 B2
(45) Date of Patent: Nov. 12, 2024

(54) MULTIPLEXER

(71) Applicant: SAMSUNG ELECTRONICS CO., LTD., Suwon-si (KR)

(72) Inventors: Hyun Ah An, Seoul (KR); Chang Sik Yoo, Seoul (KR); Jin Kwan Park, Suwon-si (KR); Sung Woo Yoon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 153 days.

(21) Appl. No.: 17/812,242

(22) Filed: Jul. 13, 2022

(65) Prior Publication Data

US 2023/0145230 A1    May 11, 2023

(30) Foreign Application Priority Data

Nov. 8, 2021  (KR) .................. 10-2021-0152336
Jan. 10, 2022 (KR) .................. 10-2022-0003403

(51) Int. Cl.
  *H03K 19/173*   (2006.01)
  *H03K 19/0185*  (2006.01)
  *H03K 19/17788* (2020.01)

(52) U.S. Cl.
  CPC ... *H03K 19/1737* (2013.01); *H03K 19/01855* (2013.01); *H03K 19/17788* (2013.01)

(58) Field of Classification Search
  None
  See application file for complete search history.

(56) References Cited

U.S. PATENT DOCUMENTS

| | | | |
|---|---|---|---|
| 6,882,211 B2 | 4/2005 | Kozaki | |
| 7,525,341 B1* | 4/2009 | Rosen | H03K 19/00323 326/38 |
| 9,366,725 B1* | 6/2016 | Kapoor | G01R 31/31721 |
| 9,674,025 B2 | 6/2017 | Dickson et al. | |
| 9,979,535 B2 | 5/2018 | Jung | |
| 10,573,373 B1 | 2/2020 | Watanabe | |
| 10,644,722 B2 | 5/2020 | Kim | |

FOREIGN PATENT DOCUMENTS

| | | |
|---|---|---|
| JP | 2012-257066 | 12/2012 |
| KR | 10-2009-0007038 | 1/2009 |

\* cited by examiner

*Primary Examiner* — Jany Richardson
(74) *Attorney, Agent, or Firm* — F. Chau & Associates, LLC

(57) ABSTRACT

A multiplexer includes a first inverter for receiving and inverting first data, a second inverter for receiving and inverting second data, and a first driver connected to an output of the first inverter and to an output of the second inverter. The first driver is configured to output the first data or the second data as output data.

13 Claims, 10 Drawing Sheets

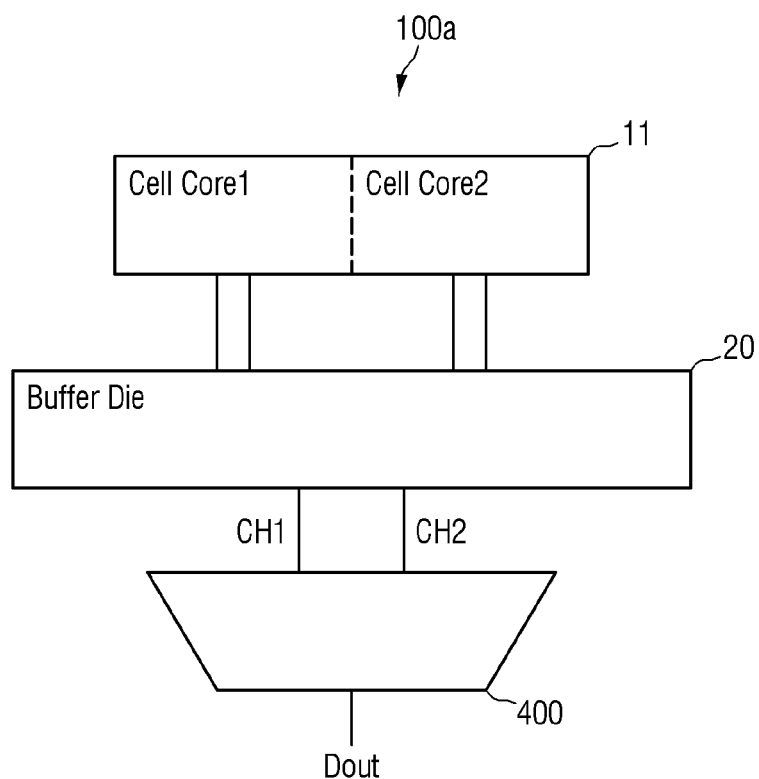
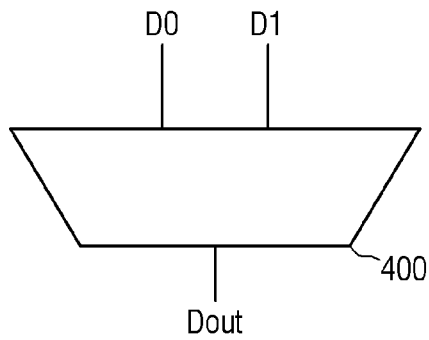

MULTIPLEXER

CROSS-REFERENCE TO RELATED APPLICATION

This application claims priority under 35 U.S.C. § 119 to Korean Patent Application No. 10-2021-0152336, filed on Nov. 8, 2021 in the Korean Intellectual Property Office, and Korean Patent Application No. 10-2022-0003403, filed on Jan. 10, 2022 in the Korean Intellectual Property Office, the disclosures of which are incorporated by reference herein in their entireties.

TECHNICAL FIELD

Embodiments of the present disclosure relate to a multiplexer.

DISCUSSION OF RELATED ART

A semiconductor memory device may include a plurality of memory cells capable of storing data therein, and may transmit/receive a command and data to and from an external system such as, for example, a memory controller.

In a semiconductor system including such a semiconductor memory device and memory controller, a multiplexer that selects only one signal among a plurality of data signals may be used.

SUMMARY

Embodiments of the present disclosure provide a multiplexer that minimizes or reduces output loading.

Embodiments of the present disclosure provide a multiplexer that is capable of minimizing or reducing output loading to increase a data transfer bandwidth.

According to an embodiment of the present disclosure, a multiplexer includes a first inverter for receiving and inverting first data, a second inverter for receiving and inverting second data, and a first driver connected to an output of the first inverter and to an output of the second inverter. The first driver is configured to output the first data or the second data as output data.

According to an embodiment of the present disclosure, a multiplexer includes a first n-type metal-oxide semiconductor (NMOS) transistor and a first p-type metal-oxide semiconductor (PMOS) transistor gated based on a first node receiving a first data signal. A drain of the first NMOS transistor and a drain of the first PMOS transistor are connected to each other at a second node. The multiplexer further includes a second NMOS transistor and a second PMOS transistor gated based on a third node receiving a second data signal. A drain of the second NMOS transistor and a drain of the second PMOS transistor are connected to each other at a fourth node. The multiplexer further includes a first driver gated based on a signal of the second node or a signal of the fourth node. The first driver is configured to output the first data signal or the second data signal as output data.

According to an embodiment of the present disclosure, a multiplexer includes a first driver for outputting first data or second data as output data, a first transfer gate and a second transfer gate gated based on a first signal and a first inverted signal obtained by inverting the first signal, and a third transfer gate and a fourth transfer gate gated based on a second signal and a second inverted signal obtained by inverting the second signal. When the first signal becomes logic high, the first driver outputs the first data as the output data, and when the second signal becomes logic high, the first driver outputs the second data as the output data.

BRIEF DESCRIPTION OF DRAWINGS

The above and other aspects and features of the present disclosure will become more apparent by describing in detail embodiments thereof with reference to the accompanying drawings, in which:

FIG. 2 is an exemplary block diagram showing some of the plurality of dies shown in FIG. 1;

FIG. 3 is an exemplary diagram illustrating the multiplexer shown in FIG. 2;

DETAILED DESCRIPTION

Figure 1:
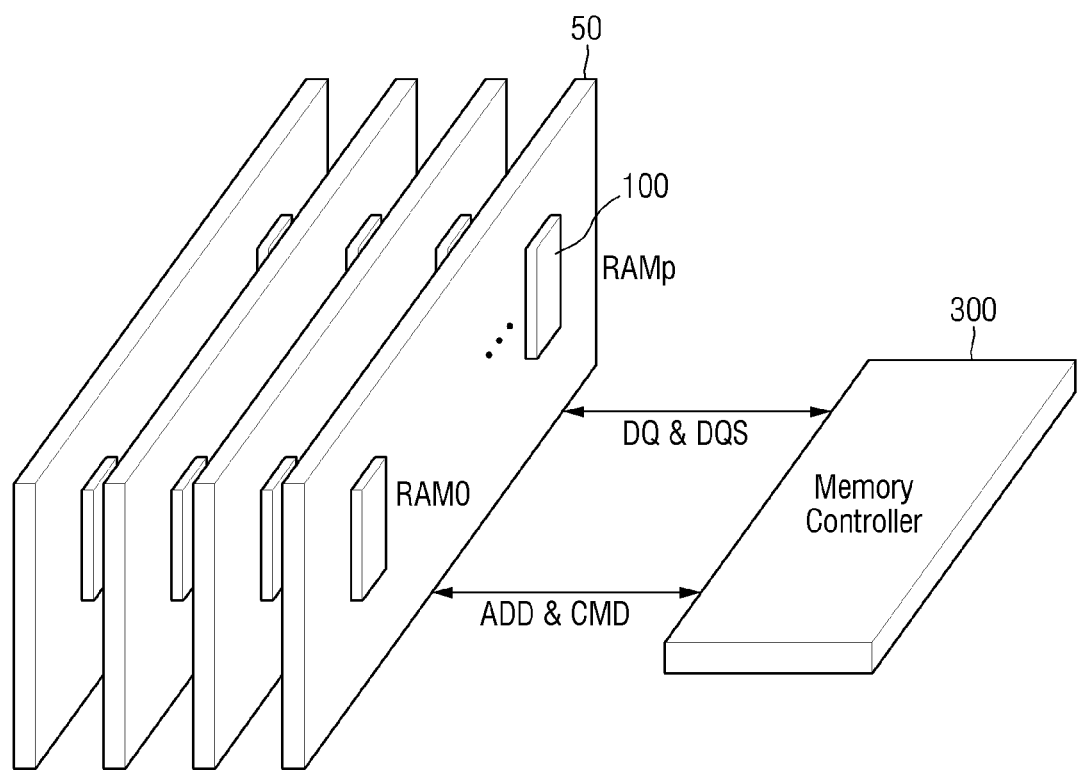
FIG. 1 is an exemplary diagram illustrating a memory system according to some embodiments.

Embodiments of the present disclosure will be described more fully hereinafter with reference to the accompanying drawings. Like reference numerals may refer to like elements throughout the accompanying drawings.

The terminology used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of at least one of the associated listed items. Expression such as "at least one of" when preceding a list of elements may modify the entirety of list of elements and not the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In an example, when a certain embodiment may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated. The features of the various embodiments of the present disclosure may be partially or entirely combined with each other, and may be technically associated with each other or operate with each other. The embodiments may be implemented independently of each other and may be implemented together in an association relationship.

A multiplexer may receive 2N (N is a natural number) data or data signals and output one data or data signal. In this regard, due to a driver connected to each of the 2N data or data signals, output loading may occur when outputting one data or data signal among the 2N data or data signals. Accordingly, the multiplexer according to some embodiments may use one driver receiving two data or data signals to implement a multiplexer receiving the 2N data or data signals using only N drivers. That is, reducing the number of drivers of the multiplexer according to some embodiments may result in minimizing or reducing the output loading. Further, this implementation may increase the data transmission bandwidth of the semiconductor system including the multiplexer according to some embodiments.

Hereinafter, an example in which a semiconductor memory device is embodied as a DRAM memory device is described as an example to which the multiplexer according to some embodiments is applied. The example to which the multiplexer according to some embodiments may be applied is not limited thereto, and may be applied to various semiconductor systems or semiconductor devices.

FIG. 1 is an exemplary diagram for illustrating a memory system according to some embodiments.

Referring to FIG. 1, a memory system 10 may include a memory module 50 and a memory controller 300.

The memory module 50 may include a plurality of dies RAM0 to RAMp, where each die corresponds to a semiconductor memory device and p is a positive integer. The memory module 50 may be implemented in a form of a single in-line memory module (SIMM) or a dual in-line memory module (DIMM).

Each of the plurality of dies RAM0 to RAMp may receive address information ADD and a command CMD from the memory controller 300, and may operate based on the received address information and the command. Each of the plurality of dies RAM0 to RAMp may transmit/receive a data signal DQ and a data strobe signal DQS to and from the memory controller 300.

The memory controller 300 may control overall operations such as, for example, read, write, and refresh operations of the memory module 50, and may be implemented as a portion of a system on chip (SoC).

FIG. 2 is an exemplary block diagram showing some of the plurality of dies shown in FIG. 1. FIG. 3 is an exemplary diagram illustrating the multiplexer shown in FIG. 2.

Referring to FIGS. 1 to 3, a semiconductor memory device 100a as any one of the plurality of dies RAM0 to RAMp may include a first die (cell die) 11, a buffer die 20, and a multiplexer 400 according to some embodiments.

The first die 11 may include at least one cell core including a plurality of memory cells. In FIG. 2, the semiconductor memory device 100a includes one cell die 11, the cell die 11 includes two cell cores, and the semiconductor memory device 100a includes a total of two cell cores. However, embodiments of the present disclosure are not limited thereto. For example, according to embodiments, the number of cell dies, the number of cell cores, and the number of memory cells included in each cell core may be arbitrarily determined (see, for example, the semiconductor memory device 100b in FIG. 6).

Each of the cell cores Cell Core1 to Cell Core2 may correspond to each of first to second channels CH1 to CH2. That is, a i-th cell core (i is one of 1 to 2) may correspond to a i-th channel CH1.

When it is stated that the cell core and the channel correspond to each other, it may mean that the signal address information ADD, the command CMD, the data signal DQ, and the data strobe signal DQS related to each of the cell cores Cell Core1 to Cell Core2 are transmitted and received via each of the channels CH1 and CH2 corresponding to each of the cell cores Cell Core1 to Cell Core2.

According to an embodiment, the cores and the channels do not correspond to each other in a 1:1 manner, but rather, may correspond to each other in a 1:n (n is an integer) or 1:m (m is an integer) manner.

The buffer die 20 may transmit a signal to the memory controller 300 via the multiplexer 400 connected to the first to second channels CH1 to CH2, and may include a plurality of logic components to perform a request (e.g., read or write) of the memory controller 300.

The multiplexer 400 receives, data or data signals (hereinafter, collectively referred to as data) D0 to D1 respectively transmitted, for example, via a plurality of channels CH1 to CH2. For example, the multiplexer 400 may receive the first data D0 via the first channel CH1, and may receive the second data D1 via the second channel CH2.

In this regard, the multiplexer 400 may output one data among the data D0 to D1 as output data Dout. The multiplexer 400 according to some embodiments may output the output data Dout via one driver connected to two input data, as described below. This will be described in further detail below with reference to FIGS. 4 and 5.

Figure 4:
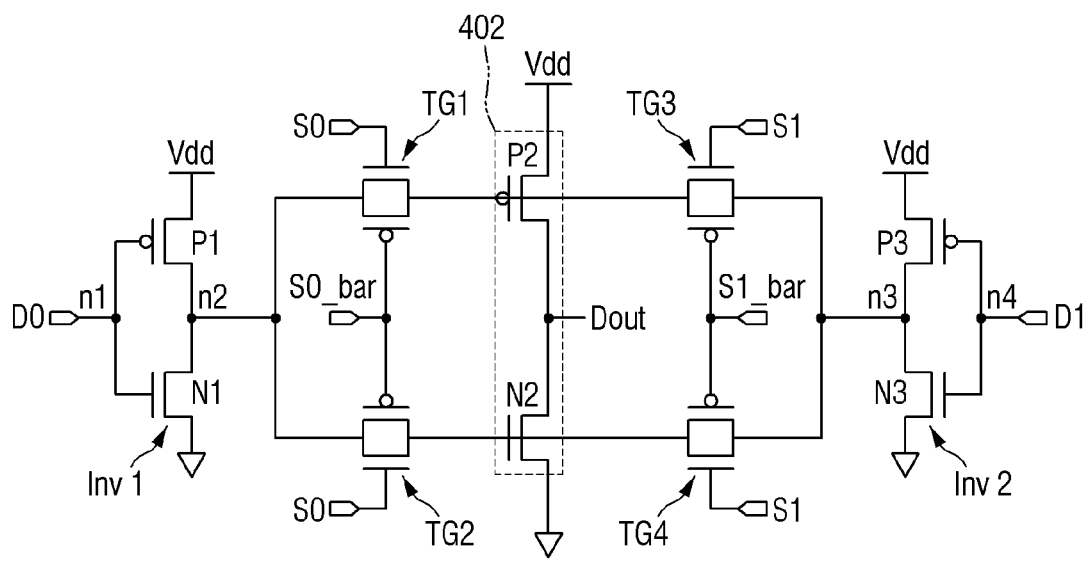
FIG. 4 is a circuit diagram illustrating a multiplexer according to some embodiments.

FIG. 4 is a circuit diagram illustrating a multiplexer according to some embodiments.

Referring to FIG. 4, the multiplexer 400 according to some embodiments includes a plurality of inverters Inv 1 and Inv 2, a plurality of transfer gates TG1, TG2, TG3, and TG4, and a driver 402.

The first inverter Inv 1 receives the first data D0 and outputs an inverted signal of the first data D0 to a second node n2. For example, the first inverter Inv 1 includes a first p-type metal-oxide semiconductor (PMOS) transistor P1 and a first n-type metal-oxide semiconductor (NMOS) transistor N1. The first PMOS transistor P1 and the first NMOS transistor N1 may be gated based on a signal of the first node n1. Further, a drain of the first PMOS transistor P1 and a drain of the first NMOS transistor N1 may be connected to each other at the second node n2.

The second inverter Inv 2 receives the second data D1 and outputs an inverted signal of the second data D1 to a third node n3. For example, the second inverter Inv 2 includes a third PMOS transistor P3 and a third NMOS transistor N3. The third PMOS transistor P3 and the third NMOS transistor N3 may be gated based on a signal of a fourth node n4.

Further, a drain of the third PMOS transistor P3 and a drain of the third NMOS transistor N3 may be connected to each other at the third node n3.

The first transfer gate TG1 and the second transfer gate TG2 may receive a signal of the second node n2 and transmit the signal to the driver 402. The first transfer gate TG1 and the second transfer gate TG2 may be gated based on a first signal S0 and a first inverted signal S0_bar obtained by inverting the first signal S0.

The third transfer gate TG3 and the fourth transfer gate TG4 may receive a signal of the third node n3 and transmit the signal to the driver 402. The third transfer gate TG3 and the fourth transfer gate TG4 may be gated based on a second signal S1 and a second inverted signal S1_bar obtained by inverting the second signal S1.

The second signal S1 may be, for example, a signal obtained by dividing the first signal S0 by 90 degrees.

The driver 402 includes a second NMOS transistor N2 and a second PMOS transistor P2. The second NMOS transistor N2 is connected to the second transfer gate TG2 and the fourth transfer gate TG4. The second PMOS transistor P2 is connected to the first transfer gate TG1 and the third transfer gate TG3. The driver 402 outputs a power voltage Vdd or logic high as the output data Dout when the second PMOS transistor P2 is turned on. Alternatively, the driver 402 outputs a ground voltage or logic low as the output data Dout when the second NMOS transistor N2 is turned on.

The multiplexer 400 according to some embodiments may transmit the first data D0 to the driver 402 via the first inverter Inv 1 and the first transfer gate TG1 and the second transfer gate TG2. Alternatively, the multiplexer 400 according to some embodiments may transmit the second data D1 to the driver 402 via the second inverter Inv 2 and the third transfer gate TG3 and the fourth transfer gate TG4.

That is, the multiplexer 400 according to some embodiments may output the first data D0 or the second data D1 as the output data Dout via one driver 402. An operation of the multiplexer 400 according to some embodiments will be described below together with a timing diagram of FIG. 5.

Figure 5:
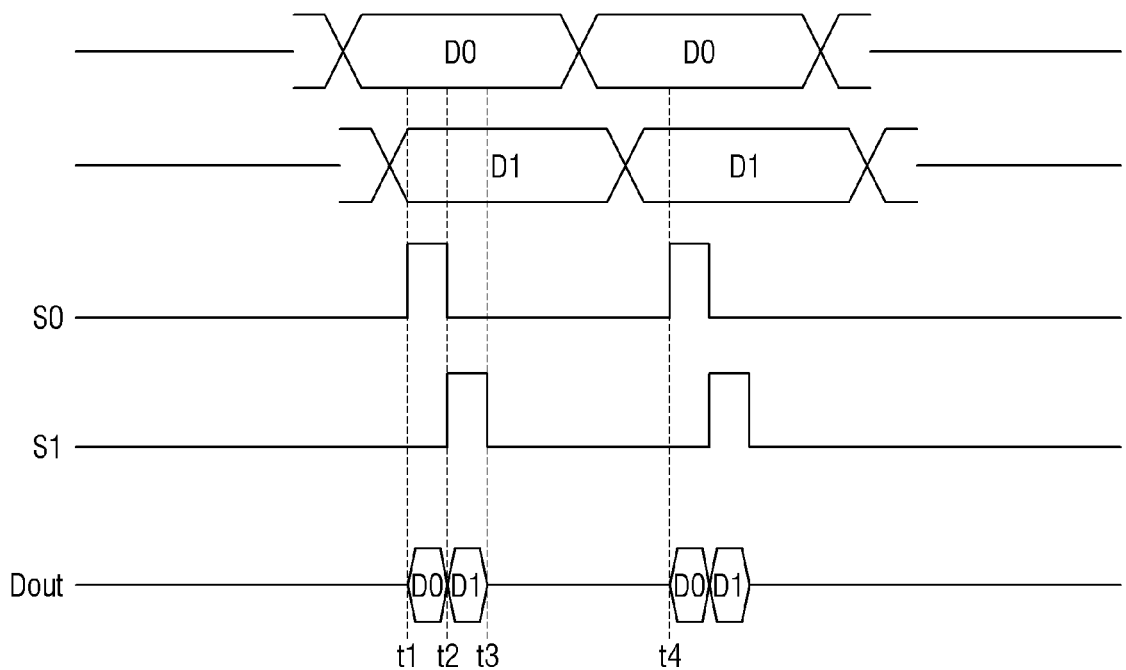
FIG. 5 is a timing diagram illustrating an operation of the multiplexer of FIG. 4 according to some embodiments.

FIG. 5 is a timing diagram illustrating an operation of the multiplexer of FIG. 4 according to some embodiments.

Referring to FIGS. 4 and 5, the multiplexer 400 according to some embodiments receives the first data D0 and the second data D1.

In this regard, for a duration from a first time t1 to a second time t2, the first signal S0 becomes logic high, and the second signal S1 becomes logic low. That is, in an embodiment, the third transfer gate TG3 and the fourth transfer gate TG4 may be turned off, so that the second data D1 is not transferred to the driver 402, and so that the first data D0 may be transferred through the turned-on first transfer gate TG1 and the turned-on second transfer gate TG2 to the driver 402. Therefore, the output data Dout output through the driver 402 may be the first data D0.

Thereafter, for a duration from the second time t2 to a third time t3, the second signal S1 becomes logic high, and the first signal S0 becomes logic low. That is, the first transfer gate TG1 and the second transfer gate TG2 may be turned off, so that the first data D0 is not transferred to the driver 402, and so that the second data D1 may be transferred through the turned-on third transfer gate TG3 and the turned-on fourth transfer gate TG4 to the driver 402. Therefore, the output data Dout output through driver 402 may be the second data D1. The above operation may be equally applied to a duration after a fourth time t4.

Figure 6:
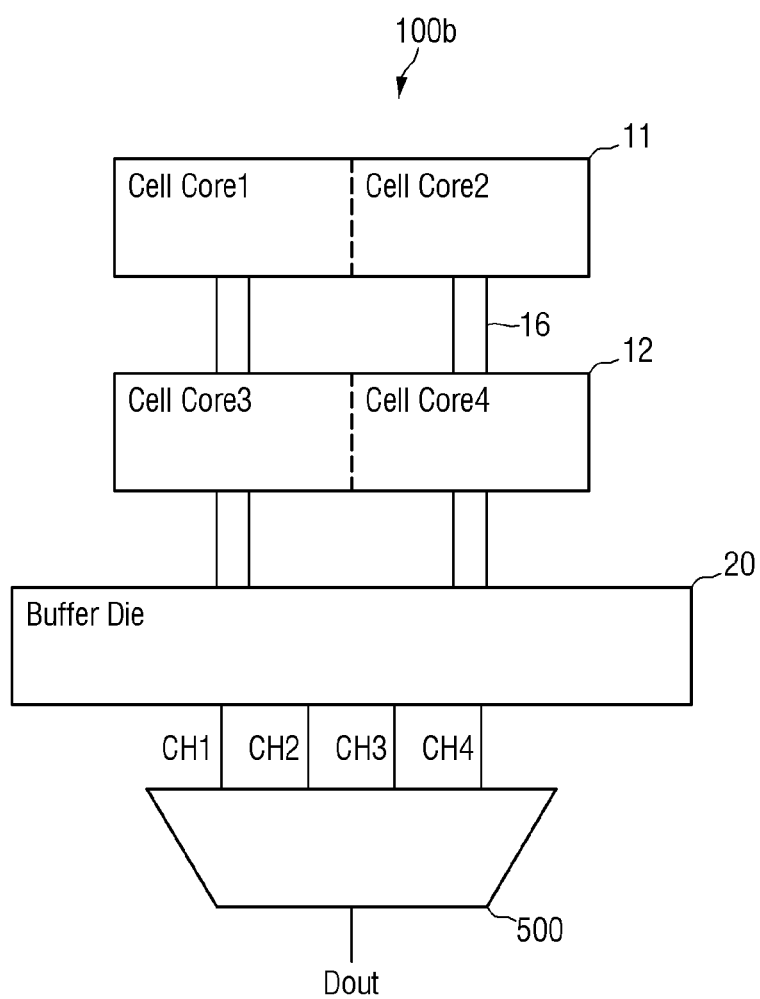
FIG. 6 is an exemplary block diagram showing some of the plurality of dies shown in FIG. 1.
Figure 7:
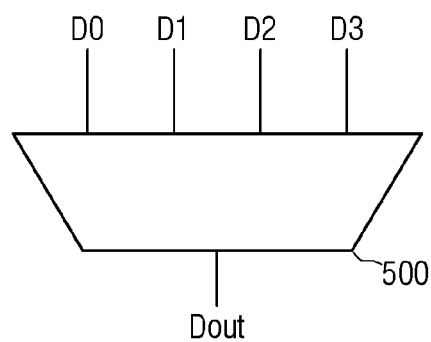
FIG. 7 is an exemplary diagram illustrating the multiplexer shown in FIG. 6.

FIG. 6 is an exemplary block diagram showing some of the plurality of dies shown in FIG. 1. FIG. 7 is an exemplary diagram illustrating the multiplexer shown in FIG. 6. For convenience of explanation, when describing FIGS. 6 and 7, a further description of elements and technical aspects previously described with reference to FIGS. 2 and 3 will be omitted.

Referring to FIGS. 6 and 7, first to second cell dies 11 to 12 may vertically overlap each other to form a stacked structure. Adjacent first to second cell dies 11 to 12 may be electrically connected to each other via a through electrode (Trough-Silicon Via: TSV) 16 including a conductive material such as copper (Cu).

For example, a signal for accessing (e.g., read, erase, or write) to the first cell die 11 may be transmitted and received via the second cell die 12 and via the through electrode (Trough-Silicon Via: TSV) 16 located between the first cell die 11 and the buffer die 20.

The buffer die 20 may transmit a signal to the memory controller 300 via a multiplexer 500 connected to the first to fourth channels CH1 to CH4, and may include a plurality of logic components to perform a request (e.g., read or write) of the memory controller 300.

The multiplexer 500 receives, for example, data or data signals (hereinafter, collectively referred to as data) D0 to D3 respectively transmitted via the plurality of channels CH1 to CH4. For example, the multiplexer 500 may receive the first data D0 via the first channel CH1, the second data D1 via the second channel CH2, the third data D2 via the third channel CH3, and the fourth data D3 via the fourth channel CH4.

In this regard, the multiplexer 500 may output one data among the data D0 to D3 as the output data Dout. As described below, the multiplexer 500 according to some embodiments may output the output data Dout via two drivers connected to four input data. This will be described in further detail below with reference to FIGS. 8 and 9.

Figure 8:
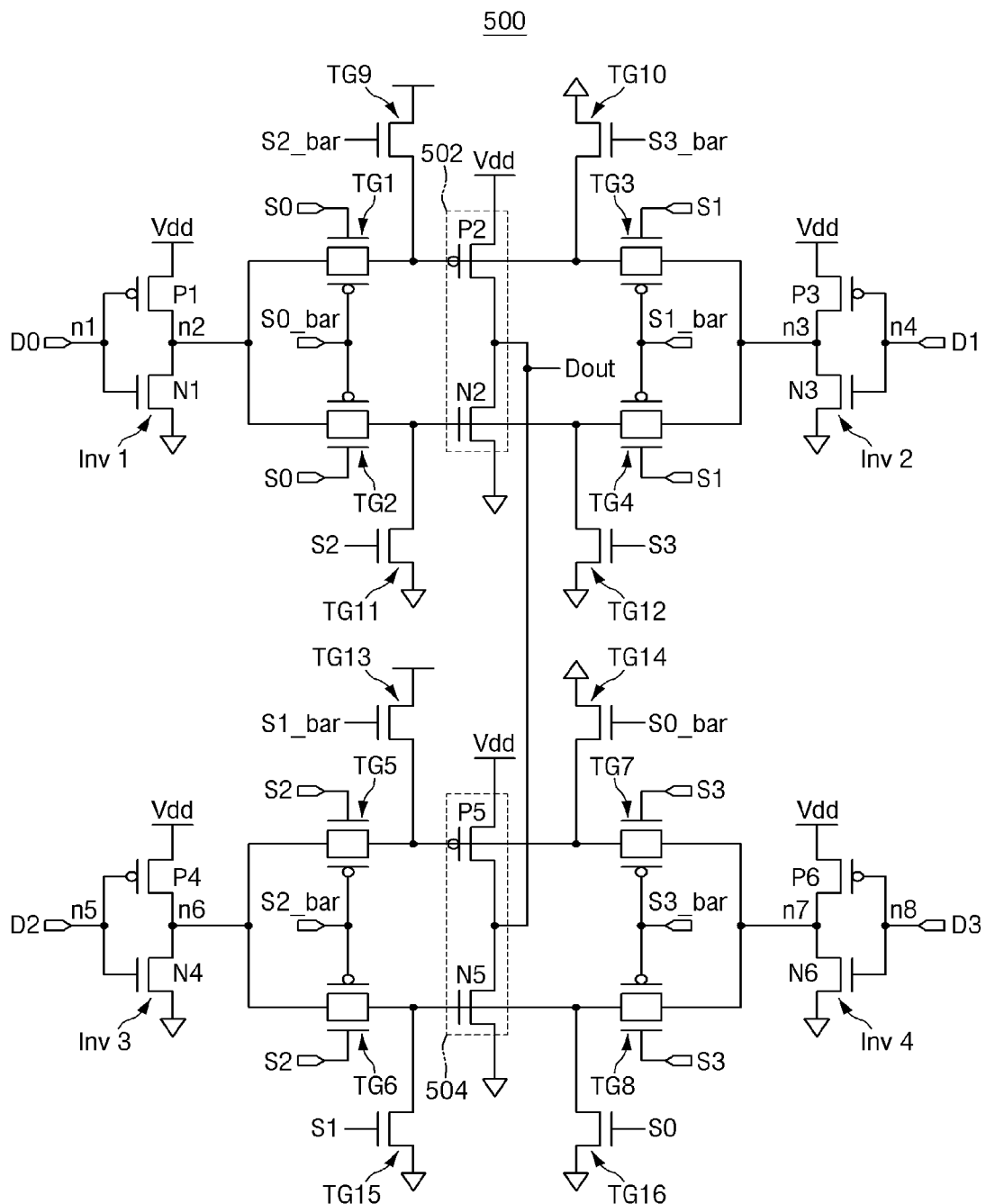
FIG. 8 is a circuit diagram illustrating a multiplexer according to some embodiments.

FIG. 8 is a circuit diagram illustrating a multiplexer according to some embodiments. Referring to FIG. 8, the multiplexer 500 according to some embodiments may include a plurality of inverters Inv 1, Inv 2, Inv 3, and Inv 4, a plurality of transfer gates TG1, TG2, TG3, TG4, TG5, TG6, TG7, and TG8, a plurality of transistors TG9, TG10, TG11, TG12, TG13, TG14, TG15, and TG16, and a plurality of drivers 502 and 504.

The first inverter Inv 1 receives the first data D0 and outputs the inverted signal of the first data D0 to the second node n2. For example, the first inverter Inv 1 includes the first PMOS transistor P1 and the first NMOS transistor N1. The first PMOS transistor P1 and the first NMOS transistor N1 may be gated based on a signal of the first node n1. Further, the drain of the first PMOS transistor P1 and the drain of the first NMOS transistor N1 may be connected to each other at the second node n2.

The second inverter Inv 2 receives the second data D1 and outputs the inverted signal of the second data D1 to the third node n3. For example, the second inverter Inv 2 includes the third PMOS transistor P3 and the third NMOS transistor N3. The third PMOS transistor P3 and the third NMOS transistor N3 may be gated based on a signal of the fourth node n4. Further, the drain of the third PMOS transistor P3 and the drain of the third NMOS transistor N3 may be connected to each other at the third node n3.

The third inverter Inv 3 receives the third data D2 and outputs an inverted signal of the third data D2 to a sixth node n6. For example, the third inverter Inv 3 includes a fourth PMOS transistor P4 and a fourth NMOS transistor N4. The fourth PMOS transistor P4 and the fourth NMOS transistor N4 may be gated based on a signal of a fifth node n5. Further, a drain of the fourth PMOS transistor P4 and a drain of the fourth NMOS transistor N4 may be connected to each other at the sixth node n6.

The fourth inverter Inv 4 receives the fourth data D3 and outputs an inverted signal of the fourth data D3 to a seventh node n7. For example, the fourth inverter Inv 4 includes a sixth PMOS transistor P6 and a sixth NMOS transistor N6. The sixth PMOS transistor P6 and the sixth NMOS transistor N6 may be gated based on a signal of an eighth node n8. Further, a drain of the sixth PMOS transistor P6 and a drain of the sixth NMOS transistor N6 may be connected to each other at the eighth node n8.

The first transfer gate TG1 and the second transfer gate TG2 may receive the signal from the second node n2 and transmit the signal to the first driver 502. The first transfer gate TG1 and the second transfer gate TG2 may be gated based on the first signal S0 and the first inverted signal S0_bar obtained by inverting the first signal S0.

The third transfer gate TG3 and the fourth transfer gate TG4 may receive a signal of the third node n3 and transmit the signal to the first driver 502. The third transfer gate TG3 and the fourth transfer gate TG4 may be gated based on the second signal S1 and the second inverted signal S1_bar obtained by inverting the second signal S1.

The fifth transfer gate TG5 and the sixth transfer gate TG6 may receive a signal of the sixth node n6 and transmit the signal to the second driver 504. The fifth transfer gate TG5 and the sixth transfer gate TG6 may be gated based on the third signal S2 and a third inverted signal S2_bar obtained by inverting the third signal S2.

The seventh transfer gate TG7 and the eighth transfer gate TG8 may receive a signal of the eighth node n8 and transmit the signal to the second driver 504. The seventh transfer gate TG7 and the eighth transfer gate TG8 may be gated based on the fourth signal S3 and a fourth inverted signal S3_bar obtained by inverting the fourth signal S3.

The transistor TG9 may be connected to and disposed between the first transfer gate TG1 and the first driver 502, and may be gated based on the third inverted signal S2_bar. Further, a drain of transistor TG9 may be connected to the power voltage Vdd.

The transistor TG10 may be connected to and disposed between the third transfer gate TG3 and the first driver 502, and may be gated based on the fourth inverted signal S3_bar. Further, a drain of transistor TG10 may be connected to the power voltage Vdd.

The transistor TG11 may be connected to and disposed between the second transfer gate TG2 and the first driver 502, and may be gated based on the third signal S2. Further, a source of the transistor TG11 may be connected to the ground voltage.

The transistor TG12 may be connected to and disposed between the fourth transfer gate TG4 and the first driver 502 and may be gated based on the fourth signal S3. Further, a source of transistor TG12 may be connected to the ground voltage.

The transistor TG13 may be connected to and disposed between the fifth transfer gate TG5 and the second driver 504, and may be gated based on the second inverted signal S1_bar. Further, a drain of transistor TG13 may be connected to the power voltage Vdd.

The transistor TG14 may be connected to and disposed between the seventh transfer gate TG7 and the second driver 504, and may be gated based on the first inverted signal S0_bar. Further, a drain of transistor TG14 may be connected to the power voltage Vdd.

The transistor TG15 may be connected to and disposed between the sixth transfer gate TG6 and the second driver 504, and may be gated based on the second signal S1. Further, a source of transistor TG15 may be connected to the ground voltage.

The transistor TG16 may be connected to and disposed between the eighth transfer gate TG8 and the second driver 504, and may be gated based on the first signal S0. Further, a source of transistor TG16 may be connected to the ground voltage.

The second signal S1, the third signal S2, and the fourth signal S3 may be, for example, obtained by dividing the first signal S0 by 90 degrees, 180 degrees, and 270 degrees, respectively.

The first driver 502 includes the second NMOS transistor N2 and the second PMOS transistor P2. The second NMOS transistor N2 is connected to the second transfer gate TG2 and the fourth transfer gate TG4. The second PMOS transistor P2 is connected to the first transfer gate TG1 and the third transfer gate TG3. The first driver 502 outputs the power voltage Vdd or logic high as the output data Dout when the second PMOS transistor P2 is turned on. Alternatively, the first driver 502 outputs the ground voltage or logic low as the output data Dout when the second NMOS transistor N2 is turned on.

The second driver 504 includes a fifth NMOS transistor N5 and a fifth PMOS transistor P5. The fifth NMOS transistor N5 is connected to the fifth transfer gate TG5 and the seventh transfer gate TG7. The fifth PMOS transistor P5 is connected to the sixth transfer gate TG6 and the eighth transfer gate TG8. The second driver 504 outputs the power voltage Vdd or logic high as the output data Dout when the fifth PMOS transistor P5 is turned on. Alternatively, the second driver 504 outputs the ground voltage or logic low as the output data Dout when the fifth NMOS transistor N5 is turned on.

The multiplexer 500 according to some embodiments may transmit the first data D0 to the driver 402 via the first inverter Inv 1 and the first transfer gate TG1 and the second transfer gate TG2. Alternatively, the multiplexer 500 according to some embodiments may transmit the second data D1 to the driver 402 via the second inverter Inv 2 and the third transfer gate TG3 and the fourth transfer gate TG4. Alternatively, the multiplexer 500 according to some embodiments may transmit the third data D2 to the driver 402 via the third inverter Inv 3 and the fifth transfer gate TG5 and the sixth transfer gate TG6. Alternatively, the multiplexer 500 according to some embodiments may transmit the fourth data D3 to the driver 402 via the fourth inverter Inv 4 and the seventh transfer gate TG7 and the eighth transfer gate TG8.

That is, the multiplexer 500 according to some embodiments may output the first data D0, the second data D1, the third data D2, or the fourth data D3 as the output data Dout via the two drivers 402. An operation of the multiplexer 500 according to some embodiments will be described below together with a timing diagram of FIG. 9.

Figure 9:
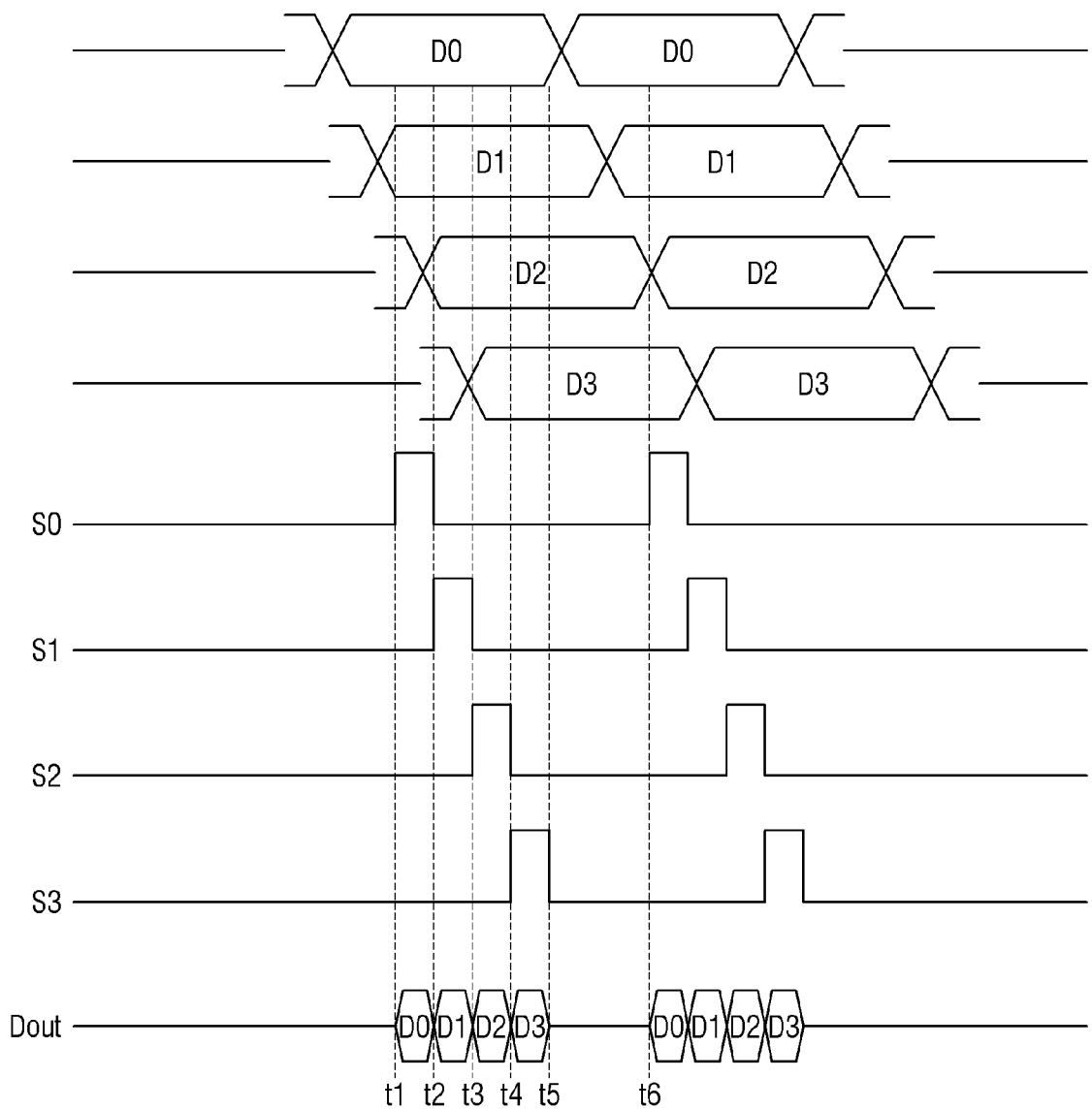
FIG. 9 is a timing diagram illustrating the operation of the multiplexer of FIG. 8 according to some embodiments.

FIG. 9 is a timing diagram illustrating the operation of the multiplexer of FIG. 8 according to some embodiments.

Referring to FIGS. 8 and 9, the multiplexer 500 according to some embodiments receives the first data D0, the second data D1, the third data D2, and the fourth data D3.

In this regard, for a duration from the first time t1 to the second time t2, the first signal S0 becomes logic high, and each of the second signal S1, the third signal S2, and the fourth signal S3 become logic low. That is, in an embodiment, the third transfer gate TG3 to the eighth transfer gate TG8 may be turned off, so that the second data D1 to the fourth data D3 are not transmitted to the first driver 502 and/or the second driver 504, and so that the first data D0 may be transmitted to the first driver 502 via the turned-on first transfer gate TG1 and the turned-on second transfer gate TG2. Accordingly, the output data Dout output through the first driver 502 may be the first data D0.

Thereafter, for a duration from the second time t2 to the third time t3, the second signal S1 becomes logic high, and each of the first signal S0, the third signal S2, and the fourth signal S3 become logic low. That is, in an embodiment, the first transfer gate TG1, the second transfer gate TG2, and the fifth transfer gate TG5 to the eighth transfer gate TG8 may be turned off, so that the first data D0, the third data D2, and the fourth data D3 are not transferred to the first driver 502 and/or the second driver 504, and so that the second data D1 may be transmitted to the first driver 502 via the turned-on third transfer gate TG3 and the turned-on fourth transfer gate TG4. Accordingly, the output data Dout output through the first driver 502 may be the second data D1.

Thereafter, for a duration from the third time t3 to a fourth time t4, the third signal S2 becomes logic high, and each of the first signal S0, the second signal S1, and the fourth signal S3 become logic low. That is, in an embodiment, the first transfer gate TG1, the second transfer gate TG2, the third transfer gate TG3, the fourth transfer gate TG4, the seventh transfer gate TG7, and the eighth transfer gate TG8 may be turned off, so that the first data D0, the second data D1 and fourth data D3 are not transmitted to the first driver 502 and/or the second driver 504, and so that the third data D2 may be transmitted to the second driver 504 via the turned-on fifth transfer gate TG5 and the turned-on sixth transfer gate TG6. Therefore, the output data Dout output through the second driver 504 may be the third data D2.

Thereafter, for a duration from the fourth time t4 to a fifth time t5, the fourth signal S3 becomes logic high, and each of the first signal S0 to the third signal S2 become logic low. That is, in an embodiment, the first transfer gate TG1 to the sixth transfer gate TG6 may be turned off, so that the first data D0 to the third data D2 are not transmitted to the first driver 502 and/or the second driver 504, and so that the fourth data D3 may be transmitted to the second driver 504 via the turned-on seventh transfer gate TG7 and the turned-on eighth transfer gate TG8. Accordingly, the output data Dout output through the second driver 504 may be the fourth data D3.

The above operation may be equally applied to a duration after a sixth time t6.

Figure 10:
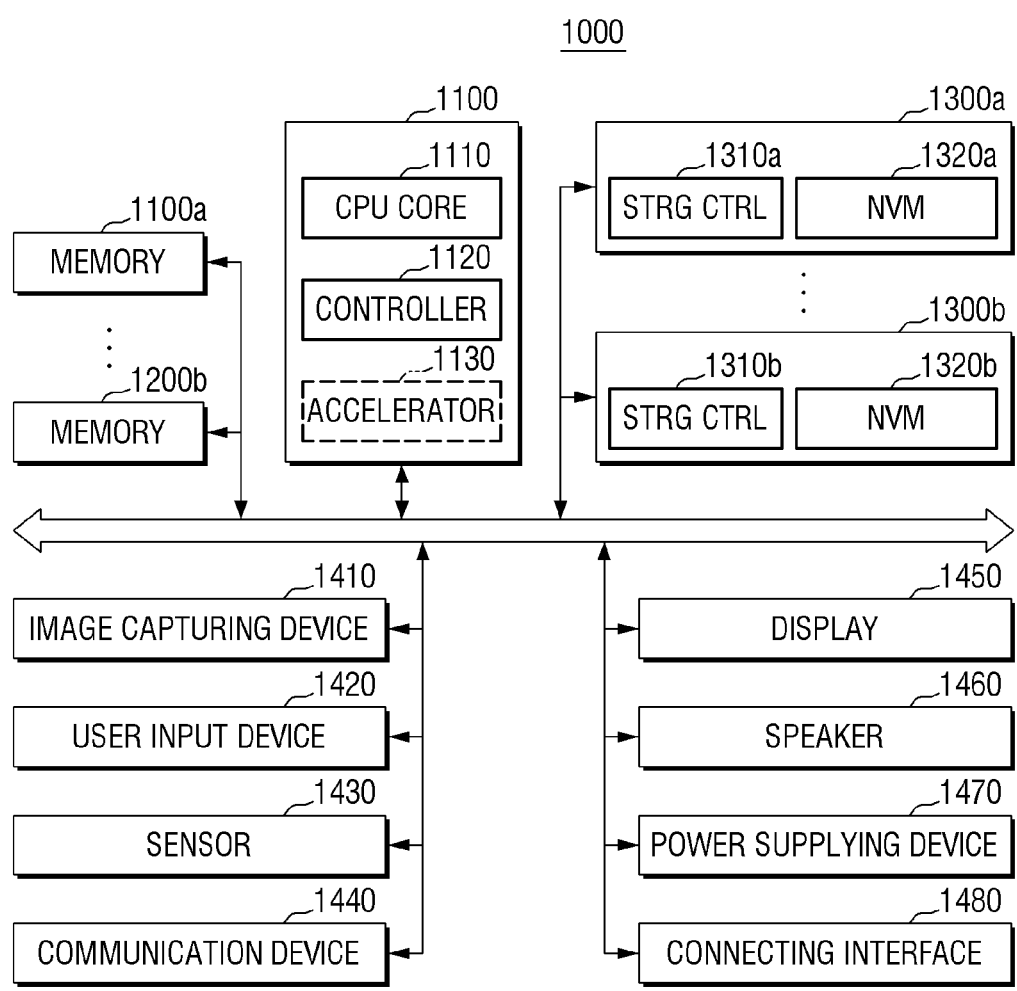
FIG. 10 is an exemplary diagram illustrating a system according to some embodiments.

FIG. 10 is an exemplary diagram illustrating a system according to some embodiments.

FIG. 10 is a view showing a system 1000 including the multiplexer according to some embodiments, as described above with reference to FIGS. 1 to 9. The system 1000 in FIG. 10 may be embodied as a mobile system such as, for example, a portable communication terminal (mobile phone), a smartphone, a tablet personal computer, a wearable device, a healthcare device, or an Internet of Things (IoT) device. However, the system 1000 in FIG. 10 is not necessarily limited to a mobile system, and may be embodied as, for example, a personal computer, a laptop computer, a server, a media player, or an automotive device such as a navigation device.

Referring to FIG. 10, the system 1000 may include a main processor 1100, a memory 1200a and 1200b and a storage device 1300a and 1300b. The system 100 may further include at least one of an imaging device (image capturing device) 1410, a user input device 1420, a sensor 1430, a communication device 1440, a display 1450, a speaker 1460, a power supply device 1470 and a connection interface 1480.

The main processor 1100 may control overall operations of the system 1000, for example, operations of other components constituting the system 1000. The main processor 1100 may be implemented as, for example, a general-purpose processor, a dedicated processor, an application processor, etc.

The main processor 1100 may include at least one CPU core 1110, and may further include a controller 1120 for controlling the memory 1200a and 1200b and/or the storage device 1300a and 1300b. According to an embodiment, the main processor 1100 may further include an accelerator 1130 as a dedicated circuit for high-speed data computing such as artificial intelligence (AI) data computing. The accelerator 1130 may include, for example, a graphics processing unit (GPU), a neural processing unit (NPU), and/or a data processing unit (DPU), etc., and may be implemented as a separate chip that is physically independent from other components of the main processor 1100.

The memory 1200a and 1200b may be used as a main memory device of the system 1000, and may include a volatile memory such as, for example, SRAM and/or DRAM, or may include a non-volatile memory such as, for example, flash memory, PRAM, MRAM and/or RRAM. The memory 1200a and 1200b and the main processor 1100 may be implemented in the same package.

The storage device 1300a and 1300b may function as a non-volatile storage device that stores data therein regardless of whether power is supplied thereto. The storage device may have a relatively large storage capacity compared to that of the memory 1200a and 1200b. The storage device 1300a and 1300b may include a storage controller 1310a and 1310b and a non-volatile memory (NVM) 1320a and 1320b that stores data therein under control of the storage controller 1310a and 1310b. The non-volatile memory 1320a and 1320b may include a flash memory of a 2-dimensional (2D) structure or a 3-dimensional (3D) vertical NAND (VNAND) structure, or may include other types of non-volatile memories such as, for example, PRAM and/or RRAM.

The storage device 1300a and 1300b may be included in the system 1000 in a state physically separated from the main processor 1100. Alternatively, the storage device 1300a and 1300b and the main processor 1100 may be implemented in the same package. Further, the storage device 1300a and 1300b may be embodied as a solid state device (SSD) or a memory card, and thus, may be detachably coupled to other components of the system 1000 via an interface such as the connection interface 1480 to be described in further detail below. The storage device 1300a and 1300b may be embodied as a device to which a standard protocol such as, for example, universal flash storage (UFS), embedded multi-media card (eMMC), or non-volatile memory express (NVMe) is applied. However, embodiments of the present disclosure are not limited thereto.

The imaging device 1410 may capture a still image or a moving image, and may be embodied as, for example, a camera, a camcorder, a webcam, etc.

The user input device 1420 may receive various types of data input from a user of the system 1000, and may be embodied as, for example, a touch pad, a keyboard, a mouse, and/or a microphone.

The sensor 1430 may detect various types of physical quantities that may be obtained from outside out of the system 1000, and may convert the sensed physical quantity into an electrical signal. The sensor 1430 may include, for example, a temperature sensor, a pressure sensor, an illumination sensor, a position sensor, an acceleration sensor, a biosensor, and/or a gyroscope sensor.

The communication device 1440 may transmit and receive signals to and from other devices out of the system 1000 according to various communication protocols. The communication device 1440 may be composed of, for example, an antenna, a transceiver, and/or a modem.

The display 1450 and the speaker 1460 may function as output devices for outputting visual information and audible information to the user of the system 1000, respectively.

The power supply device 1470 may appropriately convert power supplied from a battery built into the system 1000 and/or an external power supply, and supply the converted power to each of the components of the system 1000.

The connection interface 1480 may provide a connection between the system 1000 and an external device that is connected to the system 1000 to transmit and receive data to and from the system 1000. The connection interface 1480 may be embodied as various interfaces such as, for example, Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVMe, IEEE 1394, universal serial bus (USB), secure digital (SD) card, multi-media card (MMC), eMMC, UFS, embedded Universal Flash Storage (eUFS), compact flash (CF) card interface, etc.

Figure 11:
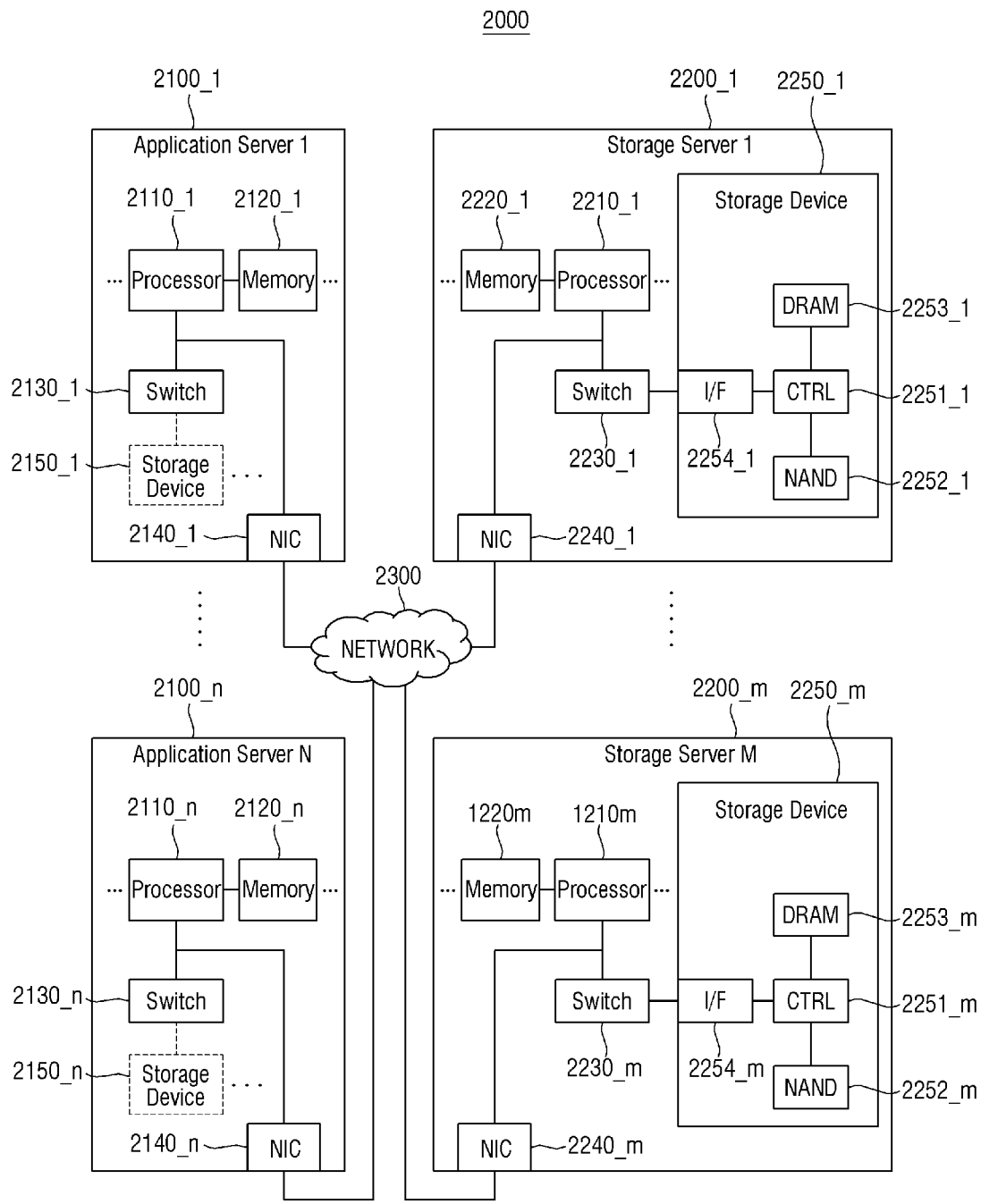
FIG. 11 is an exemplary diagram illustrating a data center according to some embodiments.

FIG. 11 is an exemplary diagram illustrating a data center according to some embodiments.

Referring to FIG. 11, a data center 2000 may be a facility that collects various data and provides services, and may also be referred to as a data storage center. The data center 2000 may be a system for operating a search engine and database, or may be a computing system used in a business such as a bank or a government institution. The data center 2000 may include application servers 2100_1 to 2100_n and storage servers 2200_1 to 2200_m, where each of n and m is a positive integer. The number of the application servers 2100_1 to 2100_n and the number of the storage servers 2200_1 to 2200_m may be variously selected according to embodiments. The number of the application servers 2100_1 to 2100_n and the number of the storage servers 2200_1 to 2200_m may be different from each other.

The application server 2100_1 or the storage server 22001 may include at least one of a processor 2110 or 2210, and a memory 2120 or 2220. A configuration of the storage server 2200_1 will be described by way of example. In this regard, the processor 22101 may control overall operations of the storage server 2200_1 and may access the memory 2220 to execute instructions and/or data loaded into the memory 2220. The memory 2220 may include, for example, Double Data Rate Synchronous DRAM (DDR SDRAM), High Bandwidth Memory (HBM), Hybrid Memory Cube (HMC), Dual In-line Memory Module (DIMM), Optane DIMM, or Non-Volatile DIMM (NVMDIMM). According to an embodiment, the number of the processors 2210_1 and the number of the memories 2220 included in the storage server 22001 may be variously selected. In an embodiment, the processor 2210_1 and the memory 2220 may provide a processor-memory pair. In an embodiment, the number of the processors 2210_1 and the number of the memories 2220 may be different from each other. The processor 22101 may include a single core processor or a multi-core processor. The above descriptions of the storage server 2200_1 may be similarly applied to the application server 2100. According to an embodiment, the application server 2100_1 does not include a storage device 2150. The storage server 22001 may include at least one storage device 2250_1. The number of the storage devices 2250_1 included in the storage server 22001 may be variously selected according to embodiments.

The application servers 2100_1 to 2100_n and the storage servers 2200_1 to 2200_m may communicate with each other over a network 2300. The network 2300 may be implemented using, for example, Fiber Channel (FC) or Ethernet. In this regard, FC may be a medium used for relatively high-speed data transmission, and may use an optical switch that provides high performance/high availability. Depending on an access scheme of the network 2300, the storage servers 2200_1 to 2200_m may be embodied as, for example, file storage, block storage, or object storage.

In an embodiment, the network 2300 may be embodied as a storage dedicated network such as a Storage Area Network (SAN). For example, the SAN may be an FC-SAN that uses an FC network and is implemented according to a FCP FC Protocol. In another example, the SAN may be an IP-SAN that uses a TCP/IP network and is implemented according to a SCSI over TCP/IP or Internet SCSI (iSCSI) protocol. In an embodiment, the network 2300 may be a general network such as a TCP/IP network. For example, the network 2300 may be implemented according to protocols such as FC over Ethernet (FCoE), Network Attached Storage (NAS), and NVMe over Fabrics (NVMe-oF).

Hereinafter, descriptions will be focused on the application server 2100_1 and the storage server 2200_1. The descriptions of the application server 2100_1 may be equally applied to other application servers 2100_n. The descriptions of the storage server 22001 may be equally applied to other storage servers 2200_m.

The application server 21001 may store data in one of the storage servers 2200_1 to 2200_m via the network 2300 upon receiving a request from a user or a client to store the data. Further, the application server 2100_1 may acquire data from one of the storage servers 2200_1 to 2200_m via the network 2300 upon receiving a request from a user or a client to read the data. For example, the application server 2100_1 may be implemented as a web server or Database Management System (DBMS).

The application server 21001 may access the memory 2120_n or the storage device 2150_n included in another application server 2100_n via the network 2300. Alternatively, the application server 2100_1 may access memories 2220_1 and 2220_m or the storage devices 2250_1 to 2250_m respectively included in the storage server 2200_1 to 2200_m via the network 2300. Accordingly, the application server 21001 may perform various operations on data stored in the application servers 2100_1 to 2100_n and/or the storage servers 2200_1 to 2200_m. For example, the application server 21001 may execute instructions for moving or copying data between the application servers 2100_1 to 2100_n and/or the storage servers 2200_1 to 2200_m. At this time, data may flow from the storage devices 2250_1 to 2250_m to one of the storage servers 2200_1 to 2200_m through the memories 2220_1 to 2220_m of the storage servers 2200_1 to 2200_m to the memories 2120_1 to 2120_n of the application servers 2100_1 to 2100_n, or may be directly delivered from the storage devices 2250_1 to 2250_m to of the storage servers 2200_1 to 2200_m to the memories 2120_1 to 2120_n of the application servers 2100_1 to 2100_n. The data flowing over the network 2300 may be encrypted data for security or privacy.

The storage server 2200_1 is described by way of example. An interface 22541 may provide a physical connection between the processor 2210_1 and a controller 2251_1 and a physical connection between an NIC 2240_1 and the controller 2251_1. For example, the interface 2254_1 may be implemented in a Direct Attached Storage (DAS) scheme in which the storage device 2250_1 is directly connected to a dedicated cable. Further, for example, the interface 2254_1 may be implemented in various interface schemes such as Advanced Technology Attachment (ATA), Serial ATA (SATA), external SATA (e-SATA), Small Computer Small Interface (SCSI), Serial Attached SCSI (SAS), Peripheral Component Interconnection (PCI), PCI express (PCIe), NVM express (NVMe), IEEE 2394, universal serial bus (USB), secure digital (SD) card, multi-media card (MMC), embedded multi-media card (eMMC), Universal Flash Storage (UFS), embedded Universal Flash Storage (eUFS), compact flash (CF) card interface, etc.

The storage server 2200_1 may further include a switch 2230_1 and the NIC 2240_1. The switch 22301 may selectively connect the processor 2210_1 and the storage device 2250_1 to each other or selectively connect the NIC 2240_1 and the storage device 2250_1 to each other under control of the processor 2210_1.

In an embodiment, the NIC 2240_1 may include, for example, a network interface card, a network adapter, etc. The NIC 2240_1 may be connected to the network 2300 via, for example, a wired interface, a wireless interface, a Bluetooth interface, or an optical interface. The NIC 2240_1 may include, for example, an internal memory, DSP, a host bus interface, etc., and may be connected to the processor 2210_1 and/or the switch 2230_1 via the host bus interface. The host bus interface may be implemented as one of the examples of the interface 2254_1 as described above. In an embodiment, the NIC 2240_1 may be integrated with at least one of the processor 2210_1, the switch 2230_1, and the storage device 2250_1.

In the storage servers 2200_1 to 2200_m or the application servers 2100_1 to 2100_n, the processor may transmit a command to the storage devices 2150_1 to 2150_n and 2250_1 to 2250_m or the memories 2120_1 to 2120_n and 2220_1 to 2220_m to program or read data thereto or therefrom. In this case, the data may be data error-corrected via the Error Correction Code (ECC) engine. The data may be data subjected to, for example, Data Bus Inversion (DBI) or Data Masking (DM), and may include, for example, Cyclic Redundancy Code (CRC) information. The data may be encrypted data for security or privacy.

The storage devices 2150_1 to 2150_m and 2250_1 to 2250_m may transmit a control signal and a command/address signal to the NAND flash memory devices 2252_1 to 2252_m in response to a read command received from the processor. Accordingly, when the data is read-out from the NAND flash memory devices 2252_1 to 2252_m, a Read Enable (RE) signal may be input as a data output control signal to allow the data to be output to a DQ bus. A Data Strobe (DQS) may be generated using the RE signal. The command and address signals may be latched into the page buffer according to a rising edge or a falling edge of the Write Enable (WE) signal.

The controller 22511 may control overall operations of the storage device 2250_1. In an embodiment, the controller 2251_1 may include Static Random Access Memory (SRAM). The controller 2251_1 may write data to the NAND flash 2252_1 in response to a write-in command. Alternatively, the controller 2251_1 may read-out data from the NAND flash 2252_1 in response to a read-out command. For example, the write-in command and/or the read-out command may be provided from the processor 2210_1 in the storage server 2200_1, the processor 2210_m in another storage server 2200_m, or the processor 2110_1 or 2110_n in the application server 2100_1 or 2100_n. A DRAM 2253_1 may temporarily store (buffer) data therein to be written to the NAND flash 2252_1 or data read-out from the NAND flash 2252_1. Further, the DRAM 2253_1 may store meta data therein. In this regard, the meta data may be user data or data generated by the controller 2251_1 to manage the NAND flash 3252. The storage device 2250_1 may include a Secure Element (SE) for security or privacy.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

Embodiments of the present disclosure allow for the implementation of a miniaturized semiconductor system, in which output loading occurring due to the multiplexer is reduced or minimized.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A multiplexer, comprising:
   a first inverter configured to receive and invert first data;
   a second inverter configured to receive and invert second data;
   a first driver connected to an output of the first inverter and to an output of the second inverter;
   a first transfer gate and a second transfer gate configured to transmit the first data to the first driver;
   a third transfer gate and a fourth transfer gate configured to transmit the second data to the first driver,
   wherein the first driver is configured to output the first data or the second data as output data,
   wherein the first transfer gate and the second transfer gate are gated based on a first signal and a first inverted signal obtained by inverting the first signal, and
   wherein the third transfer gate and the fourth transfer gate are gated based on a second signal and a second inverted signal obtained by inverting the second signal.

2. The multiplexer of claim 1, wherein the first driver outputs a power voltage or a ground voltage as the output data, and the first driver comprises:

a p-type metal-oxide semiconductor (PMOS) transistor configured to output the power voltage as the output data; and
an n-type metal-oxide semiconductor (NMOS) transistor configured to output the ground voltage as the output data.

3. The multiplexer of claim 1, further comprising:
a third inverter configured to receive and invert third data;
a fourth inverter configured to receive and invert fourth data; and
a second driver connected to an output of the third inverter and to an output of the fourth inverter,
wherein the second driver is configured to output the third data or the fourth data as the output data,
wherein an output of the first driver and an output of the second driver are connected to each other.

4. A multiplexer, comprising:
a first n-type metal-oxide semiconductor (NMOS) transistor and a first p-type metal-oxide semiconductor (PMOS) transistor gated based on a first node that receives a first data signal,
wherein a drain of the first NMOS transistor and a drain of the first PMOS transistor are connected to each other at a second node;
a second NMOS transistor and a second PMOS transistor gated based on a third node that receives a second data signal,
wherein a drain of the second NMOS transistor and a drain of the second PMOS transistor are connected to each other at a fourth node;
a first driver gated based on a signal of the second node or a signal of the fourth node,
wherein the first driver is configured to output the first data signal or the second data signal as output data;
a first transfer gate and a second transfer gate configured to transmit the first data signal to the first driver; and
a third transfer gate and a fourth transfer gate configured to transmit the second data signal to the first driver,
wherein the third transfer gate and the fourth transfer gate are gated based on a second signal and a second inverted signal obtained by inverting the second signal.

5. The multiplexer of claim 4, wherein the first transfer gate and the second transfer gate are gated based on a first signal and a first inverted signal obtained by inverting the first signal.

6. The multiplexer of claim 4, wherein the first driver outputs a power voltage or a ground voltage as the output data, and the first driver comprises:
a third PMOS transistor configured to output the power voltage as the output data; and
a third NMOS transistor configured to output the ground voltage as the output data.

7. The multiplexer of claim 6, further comprising:
a fourth NMOS transistor and a fourth PMOS transistor gated based on a fifth node that receives a third data signal,
wherein a drain of the fourth NMOS transistor and a drain of the fourth PMOS transistor are connected to each other at a sixth node;

a fifth NMOS transistor and a fifth PMOS transistor gated based on a seventh node that receives a fourth data signal,
wherein a drain of the fifth NMOS transistor and a drain of the fifth PMOS transistor are connected to each other at an eighth node; and
a second driver gated based on a signal of the sixth node or a signal of the eighth node.

8. A multiplexer, comprising:
a first driver configured to output first data or second data as output data;
a first transfer gate and a second transfer gate gated based on a first signal and a first inverted signal obtained by inverting the first signal; and
a third transfer gate and a fourth transfer gate gated based on a second signal and a second inverted signal obtained by inverting the second signal,
wherein when the first signal becomes logic high, the first driver outputs the first data as the output data,
wherein when the second signal becomes logic high, the first driver outputs the second data as the output data.

9. The multiplexer of claim 8, further comprising:
a first inverter connected to the first driver and configured to receive the first data; and
a second inverter connected to the first driver and configured to receive the second data.

10. The multiplexer of claim 9, further comprising:
a second driver connected to the first driver, wherein the second driver is configured to output third data or fourth data as the output data;
a fifth transfer gate and a sixth transfer gate gated based on a third signal and a third inverted signal obtained by inverting the third signal; and
a seventh transfer gate and an eighth transfer gate gated based on a fourth signal and a fourth inverted signal obtained by inverting the fourth signal,
wherein when the third signal is logic high, the second driver outputs the third data as the output data,
wherein when the fourth signal is logic high, the second driver outputs the fourth data as the output data.

11. The multiplexer of claim 10, further comprising:
a third inverter connected to the second driver and configured to receive the third data; and
a fourth inverter connected to the second driver and configured to receive the fourth data.

12. The multiplexer of claim 8, wherein the first driver comprises:
a p-type metal-oxide semiconductor (PMOS) transistor connected to the first transfer gate and the third transfer gate; and
an n-type metal-oxide semiconductor (NMOS) transistor connected to the second transfer gate and the fourth transfer gate.

13. The multiplexer of claim 8, wherein the second signal is obtained by dividing the first signal.

* * * * *